United States Patent [19]

Shannon

[11] 3,747,203

[45] July 24, 1973

[54] METHODS OF MANUFACTURING A SEMICONDUCTOR DEVICE

[75] Inventor: John Martin Shannon, Ossining, N.Y.

[73] Assignee: U.S. Philips Corporation, New York, N.Y.

[22] Filed: Nov. 13, 1970

[21] Appl. No.: 89,156

[30] Foreign Application Priority Data

Nov. 19, 1969 Great Britain .................. 52,474/69

[52] U.S. Cl. ........................ 29/578, 148/1.5, 29/576

[51] Int. Cl. ............................................ B01j 17/00

[58] Field of Search .......................... 29/576 B, 578; 148/1.5 CP; 317/235 AY; 250/49.5 T

[56] References Cited

UNITED STATES PATENTS 3,413,531 11/1968 Leith .................................. 317/235

3,562,022 2/1971 Shifrin ................................ 148/1.5

*Primary Examiner*—Charles W. Lanham
*Assistant Examiner*—W. Tupman
*Attorney*—Frank R. Trifari

[57] ABSTRACT

A method of implanting atoms of an element in a semiconductor body to change properties associated with the body, in which a layer comprising the element is provided on the body and bombarded with ions which by energy transfer cause atoms of the element to enter the body. The composition and thickness of the layer on the semiconductor body in the path of the bombarding ions being such that the majority of the ions bombarding the layer are absorbed in the layer without entering the semiconductor body.

18 Claims, 15 Drawing Figures

INVENTOR.
JOHN M. SHANNON
BY
Frank R. Trifari
AGENT

INVENTOR.

BY JOHN M. SHANNON

AGENT

INVENTOR.

BY JOHN M. SHANNON

AGENT

INVENTOR.

BY JOHN M. SHANNON

Frank R. Trifari

AGENT

INVENTOR.

JOHN M. SHANNON

BY [signature]

AGENT

METHODS OF MANUFACTURING A SEMICONDUCTOR DEVICE

This invention relates to methods of manufacturing a semiconductor device, and further relates to semiconductor devices manufactured using such methods.

It is known to implant ions of an element in a semiconductor body by direct bombardment of the body with beams of energetic ions of the element. Such methods of implantation are used at present in the manufacture of semiconductor devices to change the conductivity and/or conductivity type of surface portions of the semiconductor body. A radio frequency ion source fed with gaseous compounds comprising the said element may be used. An accelerated ion beam obtained from such a source consists of ion species in addition to the ion species it is desired to implant so that it is necessary to analyse the beam magnetically and to select the desired ion species before the ion beam enters a target chamber to bombard the body. Difficulties may be experienced in obtaining from such an ion source a sufficiently pure ion beam and/or a sufficiently high ion current for implantation in the body in accordance with such a known method. In addition, it is often necessary, for example when implanting dopant ions in a semiconductor body, to implant two species of dopant ions in separate surface portions of the solid. In this case, two separate ion bombardments and possibly two separate ion sources may be necessary.

According to the invention, in a method of manufacturing a semiconductor device, a layer provided on a semiconductor body surface is bombarded with ions in order to cause by energy transfer atoms of an element from the layer to enter an underlying surface portion of the body and be implanted therein to change in a desirable manner electrical characteristics associated with the said surface portion, the composition and thickness of the material on the semiconductor body surface in the path of the bombarding ions being such that the majority of the ions bombarding the layer are absorbed without entering the semiconductor body.

Such a process of implantation in which a layer is bombarded with ions in order to cause by energy transfer atoms of an element from the layer to enter an underlying surface portion can be designated by the term "knock-on implantation." It will be appreciated that as a consequence of the ion bombardment, some of the atoms entering the said surface portion may be ionized atoms of the said element.

The layer provided on the semiconductor body surface may be a layer consisting substantially solely of the said element, or a layer doped with a high concentration of the said element, or a layer of an alloy or compound of the said element.

Such "knock-on implantation" in which at least the majority of the ions bombarding the layer are absorbed without entering the semiconductor body provides a process for introducing atoms of an element into a semiconductor body surface portion which has certain of the advantages of ion implantation when compared with thermal diffusion, such as no high temperature heat treatments being required, and comparatively small lateral spread of implanted atoms occurring beneath the edge of a masking layer on the semiconductor body surface; however, compared with ion implantation, the process permits a certain relaxation of the requirements for the bombarding ions, so that, in many cases, the apparatus required for the bombardment can be simpler and less expensive. Furthermore, such methods can prove advantageous for implantation in a semiconductor body surface portion of atoms of certain elements of which it is difficult to obtain accelerated ion beams either of a sufficiently high purity or of a sufficiently high ion current for direct implantation in accordance with the known method described hereinbefore.

It is found that, in general, the ion range is more sensitive to target mass than is the efficiency of energy transfer; thus, by choosing appropriately the composition and thickness of the material on the semiconductor body surface in the path of the bombarding ions, it is possible in a comparatively simple manner to implant atoms of the element in the semiconductor body surface portion without implanting bombarding ions. Thus, substantially all of the ions bombarding the layer may be absorbed without entering the semiconductor body.

Such absorption of the majority or substantially all of the ions bombarding the layer is advantageous in many cases. Thus, for example, the said ions which are absorbed without entering the semiconductor body do not contribute to damage density in the semiconductor body caused by implantation. Furthermore, the choice of bombarding ion species need not be restricted severely by the particular element to be implanted (as it is in the known direct implantation method), nor by the effect of the ions on the properties of the semiconductor body surface portion. An ion species can be chosen of which it is possible to obtain a sufficiently high ion current from a comparatively simple ion source and which has a mass permitting suitable transfer of energy to the atoms of the element.

By appropriate selection of the mass and kinetic energy of the bombarding ions, in relation to the atoms of the element, it is possible to control the energy transfer from an ion to an atom of the element, and thus it is possible to control the depth of implantation of atoms of the element in the semiconductor body. Such selection of the bombarding ion can be based on simple experiments and/or on simple calculations, since the masses of both ions and the said atoms and, in many cases, the range of the ions and atoms in particular materials are known. The relative masses of the ion and the said atoms are chosen to provide a suitable transfer of energy from an ion to an atom, and the energy of the ion is chosen in accordance with the desired depth of implantation in the semiconductor body of the atoms of the element.

The thickness of the layer is chosen in accordance with the desired depth of implantation in the semiconductor body of the said atoms, and the range of the bombarding ions and the said atoms in the various materials present. In general, such dimensions are comparatively small, so that the thickness of the layer may be at most 0.1 micron, for example.

In one form, the composition and thickness of the layer are such that at least the majority of the ions bombarding the layer are absorbed in the layer and do not enter the semiconductor body. In this case, the thickness of the layer may be at least 0.05 micron, for example; the layer may be provided on the whole of the semiconductor body surface and so mask the whole surface against implantation of the bombarding ions. If it is desired to implant atoms of the element selectively in the semiconductor body surface, the layer comprising the element may be provided slectively on the surface at an opening in a comparatively thick masking layer pattern provided to mask other, underlying portions of the surface against implantation of the bombarding ions.

In another form, the said layer is provided on another layer on the semiconductor body surface, and the composition and thicknesses of the two layers are such that the majority of the ions bombarding the layer are absorbed without entering the semiconductor body, while atoms of the element from the layer penetrate the other layer and enter the semiconductor body.

The ions may be of an inert gas, for example argon or krypton, and be obtained from a gas discharge. In this case, absorption of at least the majority or substantially all of the bombarding ions without entering the semiconductor body has proved important in avoiding large concentrations, for example of neon, in the semiconductor body. It has been found that, for example, when implanting neon ion doses exceeding $10^{17}$ neon ions per $cm^2$ by direct implantation, an amorphous zone is formed in the semiconductor body, and recrystallisation of this zone is hindered by precipitation of the implanted neon into bubbles.

Other ion species may be employed, for example ions of a conductivity type determining impurity element.

The bombarding ions may have energies in the range 10 keV to 100 keV.

During bombardment by high ion doses, the thickness of the layer is reduced by sputtering.

The layer may be removed from the semiconductor body surface after implantation of the atoms. In an alternative form, at least part of the layer is present in the manufactured device, for example the layer may be a metal layer and at least a part of this metal layer may be present in the manufactured device as an electrode portion of the device; the metal layer may be of aluminum, which element is used in known semiconductor technology for electrode connections, and is both an acceptor impurity element in silicon and a poor sputterer. The electrode portion may form an ohmic contact or a rectifying contact with the semiconductor body surface.

The semiconductor device may comprise a Schottky Barrier diode, the layer be a metal layer electrode which forms a Schottky-type junction with the semiconductor body surface, and the atoms from the metal layer entering the semiconductor body surface form at the surface an intimate rectifying contact between the metal layer electrode and the semiconductor body.

Schottky Barrier diodes exhibit very short reverse recovery times compared with p - n junction diodes since minority carrier storage at the metal-semiconductor junction is very small; consequently, such diodes are desirable in many industrial applications for high speed operations. However, it is difficult by known simple deposition methods to manufacture Schottky Barrier diodes, particularly with large area metal-semiconductor junctions, having reproducible characteristics such as threshold voltage, leakage current and series resistance. These difficulties appear to be due, in part, to the presence of a contaminating film of foreign material, for example adsorbed species and surface reaction products, on the semiconductor body surface. Such a contaminating film prevents intimate contact between the metal layer electrode and the semiconductor boy so that the potential barrier at the junction varies in an erratic fashion. However, by bombarding the metal layer electrode with ions, atoms of the metal penetrate the contaminating film and enter the semiconductor body surface to form at the surface an intimate contact between the metal layer electrode and the semiconductor body. In this manner Schottky Barrier diodes of large junction area and having reproducible characteristics may be manufactured.

Of particular importance are methods in accordance with the present invention in which known-on implantation is employed to introduce conductivity type determining impurity element atoms into the semiconductor body surface portion. Thus, the element may be an impurity element characteristic of one conductivity type of the semiconductor body material and be implanted to form a semiconductor region of the one conductivity type in the semiconductor body. A high impurity element concentration characteristic of the one conductivity type can be formed at the semiconductor body surface.

Towards the end of the range of the impurity element atoms in the semiconductor body, an atom may undergo a number of strongly scattering collisions which produce Frenkel defects and bring the atom to rest, usually in an interstitial position. To restore the semiconductor crystalline form and to move impurity element atoms into substitutional positions, an annealing treatment is required. Studies indicate that the crystalline defects can be almost fully annealable at a moderate temperature below typical diffusion temperature, for example, at approximately 600°C in silicon. The annealing treatment may be performed after bombardment by the ions which cause atoms of the impurity element to enter the semiconductor body surface, and/or the body may be heated during the ion bombardment, in which case it appears that the range of the ions and the atoms in the layer and the semiconductor body is modified by the temperature. We understand the term "a method of manufacturing a semiconductor device in which atoms of an element are implanted in a semiconductor body surface portion to change electrical characteristics associated with the surface portion" to include an annealing treatment when such is necessary. Furthermore, it will be appreciated that the final extent of regions and the final location of junctions formed in the semiconductor body by implantation may be determined in certain cases only during such an annealing treatment.

The atoms of the impurity element of the one conductivity may enter a portion of the semiconductor body of the one conductivity type. Such implantation increases the surface impurity concentration of the one conductivity type, and hence the conductivity, of the semiconductor body portion. Thus, in one form, when the layer is a metal layer at least part of which forms an electrode portion of the device, a good ohmic contact can be formed between this electrode portion and the semiconductor body portion of the one conductivity type. In another form, the semiconductor device is a semiconductor photocathode, and the implanted atoms of the impurity element increase the acceptor impurity concentration of a shallow surface region of the semiconductor body portion to permit enhancement of photo-emission therefrom.

The atoms of the impurity element of the one conductivity type may enter a semiconductor body portion of the opposite conductivity type to form therewith a p - n junction.

The semiconductor device may be a device for detecting and/or measuring radiation, the layer may be provided over the whole of one major surface of the semiconductor body of the opposite conductivity type and bombarded with the ions to cause atoms of the impurity element to enter the whole of the one major surface and to form in the semiconductor body a shallow surface-adjacent region of the one conductivity type which forms with the adjacent semiconductor body portion of the opposite conductivity type a radiation-sensitive p - n junction.

A masking layer pattern may be provided selectively at the semiconductor body surface, and the said layer be provided on the masking layer pattern and on at least one unmasked portion of the semiconductor body surface, the composition and thickness of the masking layer pattern being such that, when the ions are directed at the whole of the said semiconductor body surface, atoms from the layer entering the masking layer pattern do not enter the semiconductor body surface so that implantation is selective in the semiconductor body surface.

In one form, the masking layer pattern is of insulating material, for example silica, and at least part of the pattern is present in the manufactured device as an insulating and/or passivating layer on the semiconductor body surface. In this case, when the element is an impurity element of the one conductivity type, the semiconductor device may comprise a p - n junction diode, and the atoms of the impurity element implanted selectively in the semiconductor body surface form a surface-adjacent region of the one conductivity type which forms with the adjacent semiconductor body portion of the opposite conductivity type a p - n junction, which p - n junction terminates at the said semiconductor body surface below the silica masking layer pattern.

In another form, the masking layer pattern is of metal, and at least part of the pattern is present in the manufactured device as an electrode portion of the device. The electrode portion may contact the semiconductor body surface, or may be separated therefrom, for example by a comparatively thin insulating layer.

When the element is an impurity element of the one conductivity type, atoms of which enter a portion of the semiconductor body of the opposite conductivity type, the semiconductor device may comprise an insulated gate field-effect transistor, the metal masking layer pattern comprises a metal gate electrode provided on a comparatively thin insulating layer on the semiconductor body surface, atoms of the impurity element of the one conductivity type implanted selectively in the semiconductor body surface form source and drain regions of the one conductivity type adjacent the surface, and the portion of the semiconductor body surface masked against implantation by the metal gate electrode constitutes the channel region of the insulated gate field-effect transistor.

Thus, adjacent extremities of the source and the drain regions and the location therebetween of the current-carrying channel region can be automatically aligned or registered with the metal gate electrode using such a method of implantation. An insulated gate field-effect transistor manufactured in such a manner can have a very low gate to drain capacitance because the overlap of the gate electrode with the drain electrode is small compared with an insulated gate field-effect transistor structure in which the source and drain regions are formed solely be diffusion techniques. In addition, channel regions of precisely controlled dimensions and small length may be obtained by this method. A further, comparatively thick insulating, masking layer pattern may be provided selectively at the semiconductor body surface prior to the provision thereon of the said layer comprising the impurity element, and, during the ion bombardment, the further masking layer pattern masks against implantation of the impurity element to define the outer periphery remote from the channel of both the source and drain regions. The metal masking layer pattern may further comprise metal source and drain electrodes provided on the semiconductor body surface on previously formed highly conductive semiconductor source and drain contact regions of the semiconductor body.

when the said element is an impurity element characteristic of one conductivity type of the semiconductor body material, another layer comprising an impurity element characteristic of the opposite conductivity type may be provided on the semiconductor body surface, and the two layers bombarded simultaneously with ions which by energy transfer cause atoms of the two impurity elements to enter the semiconductor body surface to change in a desirable manner the conductivity and/or conductivity type associated with surface portions of the semiconductor body. In this case, the layer comprising the impurity element characteristic of the one conductivity type may be provided on the said other layer on a portion of the semiconductor body of the opposite conductivity type. The semiconductor device may comprise a bipolar transistor having an emitter region of the said opposite conductivity type and a base region of the one conductivity type, in which method during the ion bombardment, atoms of the impurity element characteristic of the one conductivity type enter the semiconductor body from one layer to form a region of the one conductivity type associated with the base region of the transistor, and heavier atoms of the impurity element characteristic of the opposite conductivity type enter the semiconductor body to a shallower level from the other layer to form a region of the opposite conductivity type associated with the emitter of the transistor.

Such a semiconductor device may be a discrete bipolar transistor; in an alternative form, the semiconductor device is an integrated circuit comprising the bipolar transistor and at least one other circuit element, and the atoms of the two impurity elements are implanted selectively in the semiconductor body surface to form simultaneously semiconductor regions of the bipolar transistor and the other circuit element or elements.

The two layers may be provided over the whole of the said semiconductor body surface and scanned by a modulated energy beam of the ions, the energy modulation being such that atoms of the two impurity elements are selectively implanted in the semiconductor body surface to form semiconductor regions of desired configuration of the semiconductor device. In this manner, since the two layers have different collision cross-sections, diodes, resistors, capacitors, bipolar and field-effect transistors may be manufactured at the semiconductor body surface by modulating the energy of the ion beam.

The semiconductor device may be an integrated circuit, and the said semiconductor body surface be a major surface of a semiconductor layer portion at least mainly of the opposite conductivity type situated on a semiconductor substrate of the one conductivity type. The layer portion may be a thin epitaxial layer on the semiconductor substrate. Circuit elements of the integrated circuit may be mutually isolated by providing the circuit elements in island portions of the layer which are mutually separated by an isolation region of the opposite conductivity type extending from the semiconductor body surface into the layer. The isolation region may extend into the layer to the same depth as the base region. In this case, the isolation is provided in operation of the circuit by reverse-biassing the p - n junction between the isolation region and the layer such that the depletion layer formed occupies the remaining thickness of the layer between the isolation region and the substrate interface. In another form, the isolation region extends throughout the thickness of the layer and may be provided in the layer prior to the implantation of the impurity elements.

The semiconductor device may be an integrated circuit various circuit elements of which are mutually isolated by isolation channels formed subsequently in the semiconductor body. The isolation channels may comprise insulating dielectric material, at least adjacent the circuit elements, or the channels may be air isolation channels. In one form of the latter case, circuit elements may be wholly separated by air isolation and only held together by metal layer electrical interconnections, in the form of a so-called "beam-lead integrated circuit." In another form, the air isolation channels may separate semiconductor island portions comprising circuit element regions and situated on a semiconductor substrate of the opposite conductivity type, or on an insulating support.

The semiconductor body may be of silicon, of germanium, of an $A_{III} - B_V$ compound semiconductor material, or even of an $A_{II} - B_{VI}$ compound semiconductor material.

It will be evident that in the manufacture of semiconductor devices, "knock-on" implantation can be employed in conjunction with many known semiconductor techniques, for example ion implantation, epitaxial growth and thermal diffusion, and that the said layer comprising the said element need not be a layer consisting of the element, for example, a gold, antimony or aluminium layer, but may be a layer having a high concentration of the element, for example, a boron-doped silica layer.

Embodiments of the invention will now be described, by way of example, with reference to the accompanying diagrammatic drawings, in which.

In the methods of manufacturing a semiconductor device now to be described with reference to the accompanying drawings, a layer provided on a semiconductor body surface is bombarded with ions in order to cause by energy transfer atoms of an element from the layer to enter an underlying surface portion of the body and be implanted therein to change in a desirable manner electrical characteristics associated with the said surface portion, the composition and thickness of the material on the semiconductor body surface in the path of the bombarding ions being such that at least the majority of the ions bombarding the layer are absorbed without entering the semiconductor body.

A large number of semiconductor devices are manufactured from a common semiconductor wafer by forming an array of device elements simultaneously on the wafer and subsequently dividing the wafer to form individual semiconductor bodies for each individual semiconductor device. The drawings associated with each embodiment show, in cross-sectional view, only a portion of the semiconductor wafer, usually the portion which forms the semiconductor body of one semiconductor device, and it will be in relation to the semiconductor body of one semiconductor device, rather than the whole wafer, that the various stages of manufacture will be described. It will be evident that where steps such as photolithographic and etching techniques, selective implantation of atoms and annealing are referred to, these operations are effected either simultaneously at a plurality of locations on the wafer or to the whole wafer so that a plurality of individual device elements are formed which are separated by dividing the wafer at a later stage of manufacture.

EXAMPLE 1

Figure 1:
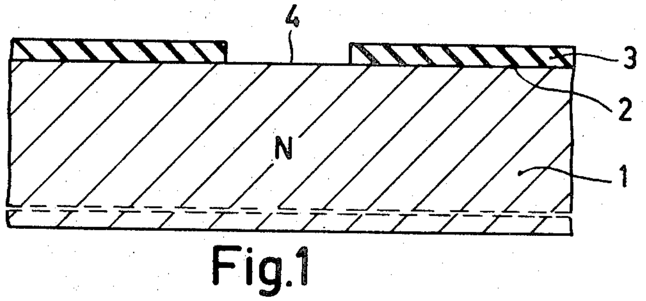
FIGS. 1 to 3 are cross-sectional views of a semiconductor body of a p - n junction diode at various stages during manufacture.
Figure 2:
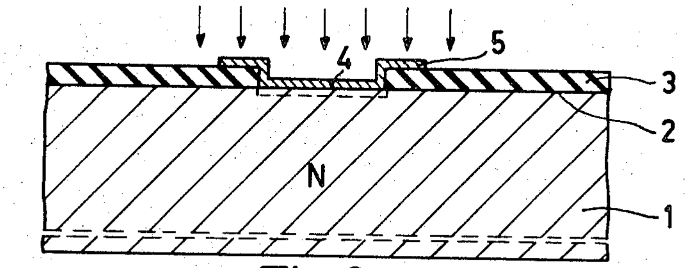
Figure 3:
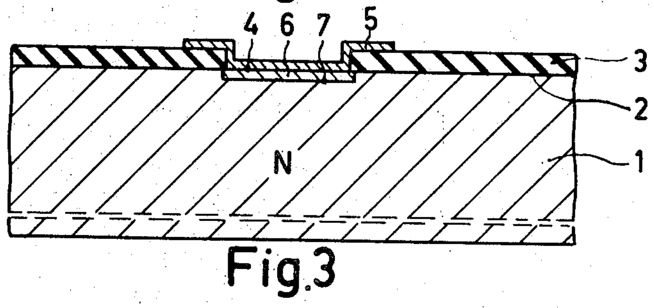

In the manufacture of a p - n junction diode, stages of which are illustrated in FIGS. 1 to 3, the starting material is an n- type silicon body 1 which forms part of an n - type monocrystalline silicon wafer. Opposite major surfaces of the silicon body 1 are parallel to <111> silicon crystal planes. The resistivity of the silicon body 1 at least adjacent one <111> silicon body surface 2 is 15 ohm-cm.

A silica layer having a thickness of 3,000 (0.3 microns) is grown on the <111> silicon body surface 2 by maintaining the body at 1,100°C in a stream of wet oxygen for approximately 20 minutes. by a photolithographic and etching step a square opening having a width of 200 microns is made in the silica layer to expose a portion 4 of the silicon body surface 2. In this manner, a comparatively thick silica masking layer pattern 3 is provided selectively on the silicon body surface 2. In another form, a comparatively thick silica masking layer pattern 3 is provided selectively at the silicon body surface 2 by selectively protecting the surface 2 against oxidation by, for example, a comparatively thin silicon nitride masking layer which is subsequently removed.

The silicon body 1 with the silica masking layepattern 3 is transferred to a vacuum evaporation apparatus and aluminum is deposited to form on the silica masking layer pattern 3 and on the unmasked portion 4 of the silicon body surface 2 an aluminum layer 5 having a thickness of 750 A. (0.075 microns). The outer periphery of the aluminum layer 5 is defined on the silica masking layer pattern 3 by etching.

The silicon body 1 with the silica masking layer pattern 3 and the aluminum layer 5 is transferred to the target chamber of an ion bombardment apparatus, and the aluminum layer 5 is bombarded with ions as indicated by the arrows in FIG. 2.

The ion source is a comparatively simple argon gas discharge which enables an accelerated argon ion beam of comparatively high purity and high ion current to be obtained. Care is taken to minimise the amount of organic background gases from pumps by fitting traps to the backing lines, and by using liquid nitrogen trapped diffusion pumps for the accelerator drift tube.

In this manner, the aluminum layer 5 is bombarded with a beam of argon ions having an ion mass of 40 a.m.u., an ion dose of $2 \times 10^{16}$ ions/cm$^2$ and an ion energy of 60 keV. The bombarding argon ions by energy transfer cause aluminum atoms to enter the silica masking layer pattern 3 and the unmasked portion 4 of the silicon body surface 2. The composition and thickness of the silica masking layer pattern 3 is such that, when the ions are directed at the whole of the said silicon body surface 2, aluminum atoms entering the masking layer pattern 3 do not enter the silicon body surface 2. In this manner, the element aluminium is implanted selectively in the silicon body surface 2.

The mean range of 60 keV argon ions in aluminum is approximately 525 A. and substantially all of the argon ions bombarding the aluminum layer 5 are absorbed in the layer 5 and do not enter the silicon body surface 2. Approximately 96 percent of the energy of the argon ions is transferred to the aluminum atoms for a head-on collision, and the resulting range of the aluminum atoms in either aluminum or silicon is approximately 900 A. Consequently, aluminum atoms penetrate to a moderate level within the silicon body 1.

Since aluminum is an acceptor impurity element in silicon, the aluminum atoms selectively implanted in the n-type silicon body surface 2 form in the body 1 a surface-adjacent p - type region which forms a p - n junction with the adjacent silicon body portion of the n - type conductivity. As mentioned hereinbefore, an annealing treament is necessary in certain cases to restore the semiconductor crystalline form and to move impurity element atoms from interstitial positions to substitutional positions in the crystal lattice. In FIG. 2, the extent of the region associated with the implanted aluminum atoms and the junction formed with the adjacent silicon body portion is shown in broken outline, since, the final extent of the region and the final location of the junction are determined during such an annealing treatment.

The annealing treatment, in this case, is performed at a low temperature to avoid the formation of an aluminum-silicon eutectic which occurs at temperatures above approximately 550°C. A low temperature annealing treatment is performed at 500°C for 30 minutes in a nitrogen atmosphere. In this manner, a high conductivity p - type anode region 6 is formed associated with the implanted aluminum atoms and having a depth of approximately 0.015 microns. The p - n junction 7 between the p type region 6 and the adjacent n - type silicon body portion terminates at the silicon body surface 2 below the silica masking layer pattern 3.

The aluminum layer 5 situated on the silica masking layer pattern 3 and the exposed portion 4 of the silicon body surface 2 makes good ohmic contact to the p - type region 6 and is retained as an anode electrode. A cathode contact is made to the adjacent n -type silicon body portion. The silicon wafer is divided into individual semdiconductor bodies for each p - n junction diode (see FIG. 3). In the manufactured device, the silica masking layer pattern 3 is present as an insulating layer to insulate part of the anode electrode 5 from the n - type silicon body portion and as a passivating layer on the surface 2 at which the p - n junction 7 terminates.

P - n junction diodes with a breakdown voltage of 15 volts have been manufactured using a method similar to that described in this Example.

EXAMPLE 2

In the manufacture of a Schottky Barrier Diode, a silica layer pattern having a thickness of approximately 0.5 microns is formed on a silicon body surface. The silica layer pattern has an opening exposing a portion of the silicon body surface of n - type conductivity. A gold layer electrode having a thickness of approximately 500 A. (0.05 microns) is formed by selective deposition of gold on the exposed portion of the silicon body surface and on adjacent portions of the silica layer pattern. The gold layer electrode forms with the exposed n- type silicon body surface portion a Schottky-type junction. However, a contaminating film of foreign material, for example adsorbed species and surface reaction products, is often present on the silicon body surface, and prevents intimate contact between the gold layer electrode and the silicon body surface.

Figure 4:
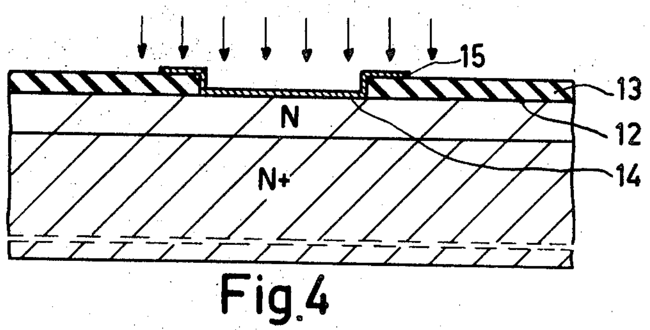
FIG. 4 is a cross-sectional view of a semiconductor body of a Schottky Barrier diode at a stage during manufacture.
Figure 5:
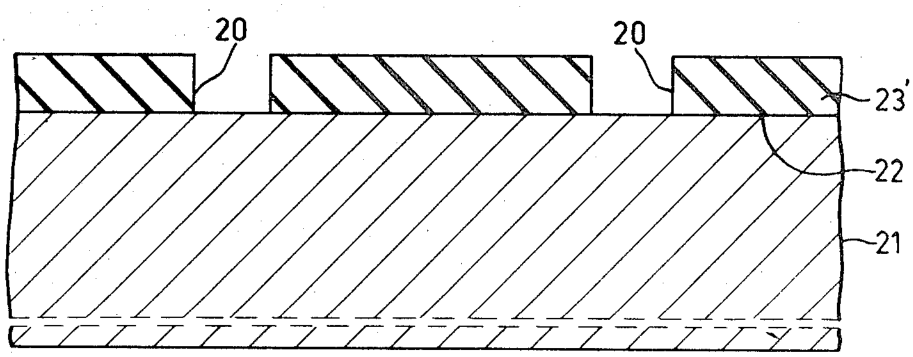
FIGS. 5 to 10 are cross-sectional views of a semiconductor body of an insulated gate field-effect transistor at various stages during manufacture.

FIG. 4 illustrates a further stage in the manufacture of the Schottky Barrier diode, in which, as indicated by arrows, ions are directed at the silicon body surface 12 to bombard the gold layer electrode 15. A heavier inert gas ion is used, for example xenon obtained from a xenon gas discharge. The bombarding xenon ions by energy transfer cause gold atoms to penetrate the contaminating film and enter the portion 14 of the silicon body surface 12 not covered by the silica layer pattern 13. The energy of the bombarding xenon ions is such that the gold atoms entering the silicon body surface 12 form at the surface an intimate rectifying contact between the gold layer electrode 15 and the n - type silicon body, and do not penetrate deeply to form a region in the body. The composition and thickness of the gold layer electrode 15 are such that xenon ions bombarding the gold layer are absorbed and do not enter the silicon body surface 12. The ions bombarding portions of the silica layer pattern 13 not covered by the gold layer electrode 15, are absorbed in the silica layer pattern 13. No high temperature annealing treatment is required.

EXAMPLE 3

In the manufacture of an insulated gate field effect transistor, stages of which are illustrated in FIGS. 5 to 10, a silica layer having a thickness of approximately 1 micron is grown at a surface 22 of an n-type silicon body 21. By photolithographic and etching techiques two openings 20 are made in the silica layer to expose portions of the silicon body surface where source and drain highly conductive contact regions are to be provided, see FIG. 5.

Figure 6:
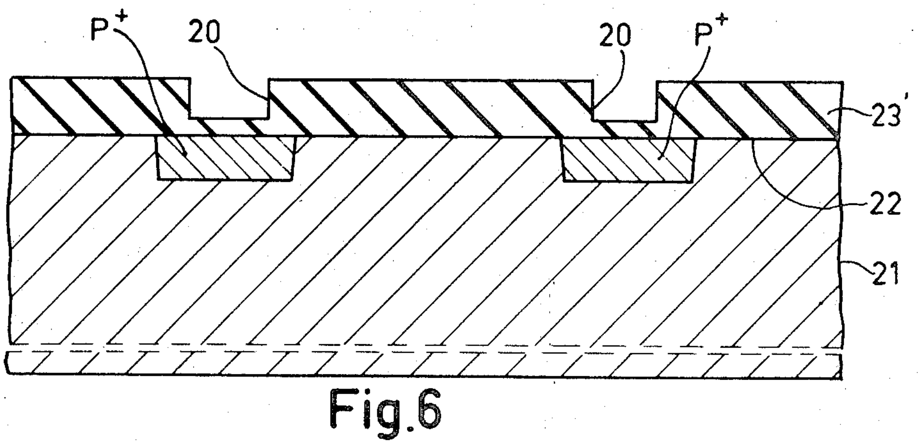
Figure 7:
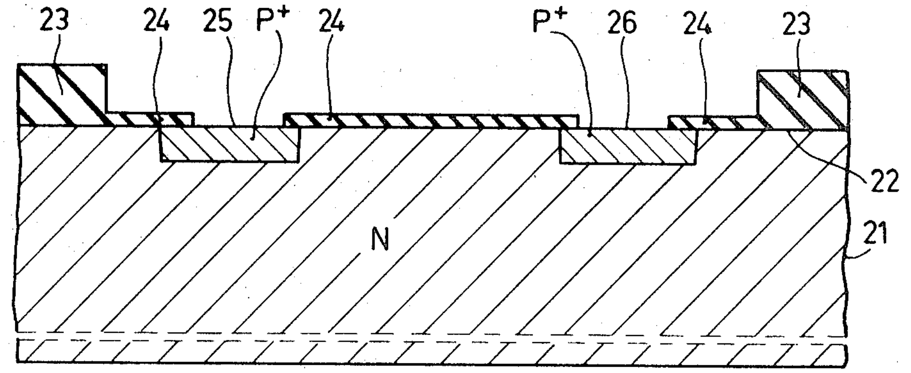

By a boron diffusion into the exposed silicon body surface portions, highly conductive diffused source and drain contact regions $P^+$ are formed; during this diffusion silica regrows to form a thin layer in the openings 20, and the silica layer 23' grows thicker. The resulting structure is shown in FIG. 6.

By photolithographic and etching techniques an opening having a width of 40 microns is made in the silica layer 23' to expose a portion of the silicon body surface 22 which includes the contact regions $P^+$. In this manner, a comparatively thick silica masking layer pattern 23 is provided on the silicon body surface 22.

A silica layer of less than 1,000 A. thickness is grown on the exposed portion of the silicon body surface 22 by maintaining the body 21 at 1,000°C in a stream of wet oxygen. The thickness of the comparatively thick silica masking layer pattern 23 is increased during this step.

By photo-lithographic and etching techniques, openings having a width of approximately 5 microns are then formed in the thinner silica layer to expose portions 25 and 26 of the silicon body surface 22 where source and drain electrodes will contact the source and drain contact regions $P^+$ of the transistor. In this manner, a comparatively thin silica layer pattern 24 is formed (see FIG. 7).

Figure 8:
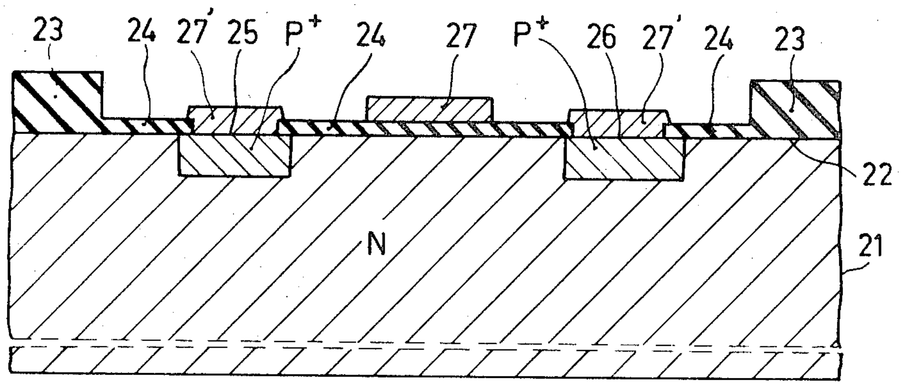

Nickel is selectively deposited on the comparatively thin silica layer pattern 24 between the source and drain contact regions $P^+$ to form a comparatively dense metal gate electrode 27 of the insulated gate field-effect transistor and on the exposed portions 25 and 26 of the source and drain contact regions $P^+$ to form source and drain electrodes 27' of the transistor. The metal gate electrode 27 has a width of 5 microns, and, as will become apparent hereinafter, this width determines the length of the current-carrying channel of the transistor. The resulting structure is shown in FIG. 8.

Aluminum is deposited on the silica layer patterns 23 and 24, on the nickel electrodes 27 and 27' to form an aluminum layer 28 having a thickness of 600 A. (0.06 microns). The outer limit of the aluminum layer 28 is defined on the comparatively thick silica masking layer pattern 23 by photo-lithographic and etching techniques.

Figure 9:
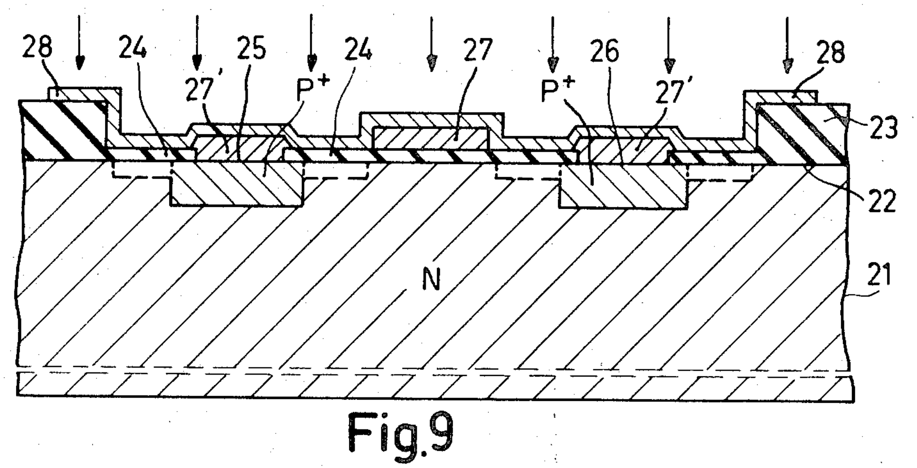
Figure 10:
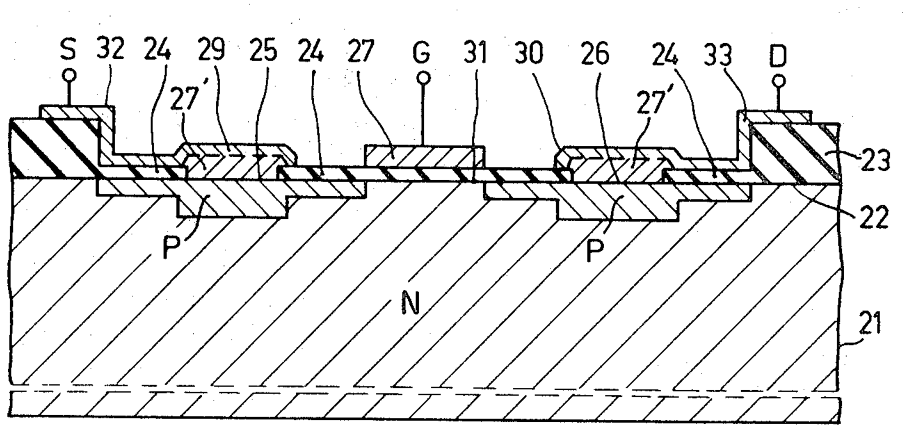

As indicated by arrows in FIG. 9, ions are driected at the silicon body surface 22 to bombard the aluminum layer 28. A beam of 160 keV krypton ions are used. Bombarding krypton ions transfer kinetic energy to aluminum atoms which consequently enter the silica layer patterns 23 and 24, the nickel gate electrode 27 and the nickel source and drain electrodes 27'.

Aluminum atoms entering both the comparatively dense nickel electrodes 27 and 27' and silica layer pattern 23 are absorbed therein and do not enter the silicon body surface 22. Aluminum atoms entering the comparatively thin silica layer pattern 24 penetrate the layer pattern 24, and enter the silicon body surface 22. Consequently, aluminum atoms are selectively implanted in the silicon body surface 22 as indicated in broken outline in FIG. 9. During the ion bombardment, the body 21 is heated to 450°C to effect an annealing treatment at a moderate temperature.

Krypton ions bombarding the aluminium layer 28 are absorbed without entering the silicon body; this absorption occurs in the material on the silicon body surface 22 into the path of the bombarding ions, namely the combination of the aluminum layer 28 with the silica layer patterns 23 and 24 or with the nickel electrodes 27 and 27'.

The aluminum atoms selectively implanted in the n - type silicon body surface 22 extend laterally the diffused contact regions $P^+$ to form p- type source and drain regions 29 and 30 adjacent the surface 22, and the portion of the surface 22 masked against implantation by the nickel gate electrode 27 forms the current-carrying channel region 31 of the insulated gate field-effect transistor. Consequently, adjacent extremities of the source and drain regions 29 and 30 and the location therebetween of the channel region 31 are automatically aligned with the nickel gate electrode 27, with very slight overlap, so that the width of the gate electrode 27 determines the length of the channel region 31 between the source and drain regions 29 and 30. The outer periphery remote from the channel region 31 of both the source and drain regions is defined by the masking effect of the comparatively thick silica masking layer pattern 23.

In choosing the thickness of the nickel gate electrode 27, there is considered the effect on the characteristics of the manufactured device of degradation in the properties of the portion of the silica layer 24 directly below the gate electrode 27; such degradation can result from implantation therein of knocked-on aluminum atoms. Thus, the nickel electrodes 27 and 27' have a sufficiently large thickness to reduce this degradation to an acceptable level.

The thickness of the silica layer 24 is chosen to give acceptable gating characteristics for the device, to permit penetration by knocked-on aluminum atoms to provide an acceptable concentration in the extended parts of the source and drain regions 29 and 30, and to absorb in combination with the aluminum layer 28 at least the majority of the bombarding krypton ions.

Through the nickel electrodes 27' at the openings in the silica layer pattern 24, thealuminum layer 28 contacts the source and drain regions 29 and 30 at the portions 25 and 26 of the silicon body surface 22. As a result of aluminum atoms entering the nickel electrodes 27' from the aluminum layer 28 during the ion bombardment, an intimate contact is formed between the aluminum layer 28 and the nickel electrodes 27'.

At least a central portion of the aluminum layer 28 is removed by photolithographic and etching techniques so that remaining portions 32 and 33 of the aluminum layer 28 form mutually isolated source and drain electrode connections respectively of the insulated gate field-effect transistor.

In this example, the wafer is subsequently divided to form the individual semiconductor bodies having the structure shown in FIG. 8, and having supply conductors S, G and D connected to the source, gate and drain electrodes.

In a modification of this Example, the device is an integrated circuit comprising a semiconductor body having regions of several insulated gate field-effect transistors formed as described in this example. After the ion bombardment, portions of the aluminum layer 28 are removed while remaining portions of the layer 28 and the electrodes 27 and 27' form electrode connections to and interconnections between individual field effect transistors. Thus, an integrated circuit is formed by providing an insulating and passivating layer pattern (23 and 24) on a semiconductor body surface, providing a metal layer (27, 27' and 28) for a contact and interconnection pattern on the insulating and passivating layer pattern and on exposed portions of the semiconductor body surface, and providing subsequently at the semiconductor body surface semiconductor regions of the integrated circuit by introduction of impurity element atoms into the semiconductor body from the metal layer. The metal layer is a multiple layer, and thickened portions 27 and 27', and 23 of the metal layer and of the insulating layer are employed to mask semiconductor body surface portions against implantation.

In both the Example and the Modification thereof, the provision of the aluminum layer 28 forms during the ion bombardment a continuous conductive layer over the insulating layer pattern 23 and 24 and interconnects the nickel electrodes 27 and 27' at a common potential; this can be an advantage in reducing high local charge concentrations which can arise from ion bombardment and can result in break-down of the insulating layer pattern and undesirable surface effects. The continuous conductive layer maintains adjacent surface parts at a substantially common potential and can be connected readily to a suitable potential source, for example, by connecting the layer to an earthing point on the ion accelerator.

EXAMPLE 4

Figure 11:
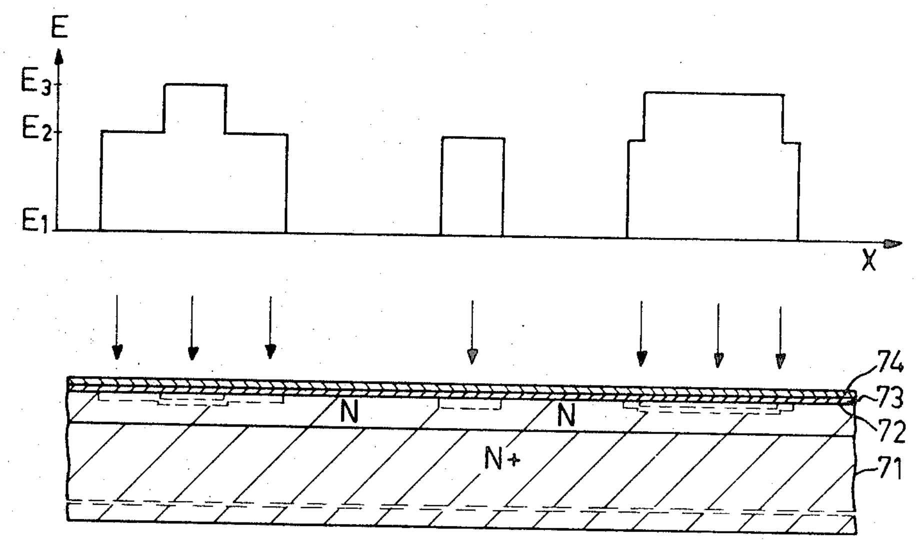
FIGS. 11 to 13 are cross-sectional views of a semiconductor body of an integrated circuit at various stages during manufacture.
Figure 12:
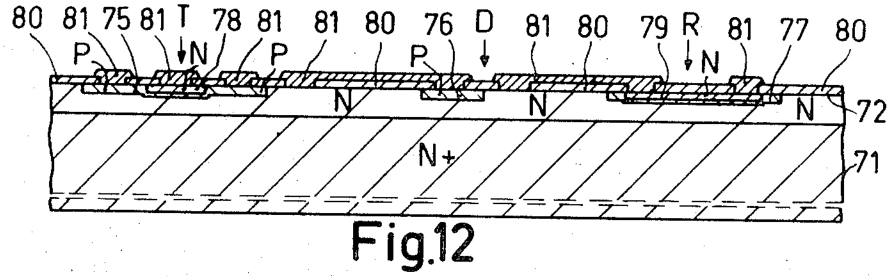
Figure 13:
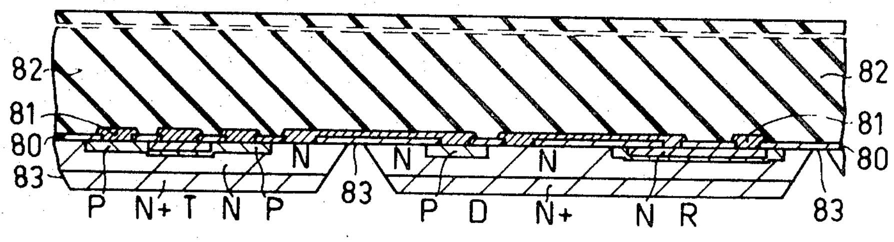

In the manufacture of an air-isolated integrated circuit, stages of which are illustrated in FIGS. 11 to 13, the starting material is an n-type silicon body 71 which forms part of an n - type silicon wafer comprising an epitaxial layer on a high conductivity $n^+$ substrate. Only the portion of the body 71 which will comprise regions of a bipolar transistor, a junction diode and a resistor of the integrated circuit is shown in the drawings. Remaining portions of the body 71 which are not shown will comprise regions of the remaining circuit elements of the complete integrated circuit.

Antimony is deposited over the whole of a surface 72 of the silicon body 71 to form a comparatively thin (0.03 microns) antimony layer 73. The silicon body surface 72 is a surface of the n-type epitaxial layer. Aluminum is deposited over the whole of the antimony layer 73 to form a comparatively thin (0.05 microns) aluminum layer 74.

As indicated by arrows in FIG. 11, ions are directed at the silicon body surface 72 to bombard the aluminum layer 74 and the antimony layer 73, and, by energy transfer, to cause antimony and aluminum atoms to enter the silicon body surface 72. The bombarding ions are of krypton and are obtained from a krypton gas discharge as an ion beam of modulated energy. A simultaneous annealing treatment is performed at 450°C. The energy of the beam varies from a low level $E_1$, through an intermediate level $E_2$ to a higher level $E_3$. Krypton ions of high energy $E_3$ have sufficient energy to penetrate the aluminum layer 74 into the antimony layer 73 and cause both aluminum atoms from the layer 74 and antimony atoms from the layer 73 to enter teh silicon body surface 72. Bombarding krypton ions of intermediate energy $E_2$ have sufficient energy to cause aluminum atoms from the layer 74 to enter the silicon body surface 72 but insufficient energy to penetrate the aluminum layer 74 and cause antimony atoms to enter the surface 72, and aluminum atoms penetrating the antimony layer 74 cause only a small number of antimony to enter the silicon body surface 72. Krypton ions of low energy $E_1$ have insufficient energy to cause either aluminum or antimony atoms to enter the silicon body surface 72, and, in certain cases, the low energy level $E_1$ may be substantially zero, in which case substantially no krypton ions bombard the layers 73 and 74.

The layers 73 and 74 are scanned by the modulated energy beam in the manner indicated in FIG. 11. The energy E of the bombarding ions is shown as a function of position $x$ across the silicon body cross-section at which particular ions are directed. As indicated, the energy modulation of the ion beam is such that aluminum and antimony atoms are selectively implanted in the semiconductor body surface to form regions of desired configuration which are shown in broken outline in FIG. 11. Consequently, the information content of the modulated energy beam is translated into an implantation pattern in the silicon body 71.

The layers 73 and 74 are removed by etching, and further annealing treatment can be performed. Implanted aluminum atoms form in the n - type epitaxial layer p - type regions constituting base region 75 of a bipolar transistor T, region 76 of a junction diode D, and an isolation region 77 of a resistor R. Implanted antimony atoms form an n - type emitter region 78 in the base region 75 of the transistor T and n - type resistor region 79 in the isolation region 77. The body is heated at approximately 450°C in a TEOS atmosphere to deposit a silica layer 80 on the whole of the silicon body surface 72, and openings in the layer 80 are formed by etching to expose underlying silicon regions. Aluminum is deposited on the silica layer 80 and on the exposed portions of the silicon body surface 72 to form an aluminum layer which is subsequently patterned by etching to form contacts to an interconnections between the various circuit elements, for example, the transistor T, the diode D and the resistor R, of the integrated circuit. The aluminum contacting and interconnection pattern is designated by numeral 81 in FIG. 12.

Air isolation is employed to electrically insulate the circuit elements within the circuit. Glass is applied to the body surface having the silica layer 80 and the aluminum pattern 81 to form a rigid, insulating support 82. The silicon body 71 is then thinned using a mechanical grinding process to remove material from the major body surface opposite the surface 72; in this manner, the majority of the $n^+$ substrate of the body 71 is removed. Air isolation channels are now formed in the thinned body 71 by anisotropic etching from the body surface opposite the surface 72 to separate body portions associated with various circuit elements. Part of the resulting structure is shown in FIG. 13, where an air isolation channel 83 separates a body portion associated with the transistor T and a body portion associated with the diode D and the resistor R.

EXAMPLE 5

In the manufacture of a gallium arsenide photocathode now to be described with reference to FIGS. 14 and 15, the starting material is a high quality p - type gallium arsenide substrate 91, which has an acceptor impurity concentration of $10^{15}$ atoms/c.c.

It is known that gallium arsenide associated with cesium is photo-emissive. Electromagnetic radiation of more than 1.4 eV. forms electron-hole pairs in the gallium arsenide and the electrons within a diffusion length of the surface are able to escape from the surface. In order to obtain reasonable quantum efficiencies, the bending of energy bands at the gallium arsenide surface should take place over a very short distance; this requires a high gallium arsenide impurity concentration, for example an acceptor concentration of at least $5 \times 10^{19}$ atoms/c.c. However, the minority charge carrier lifetimes and hence minority carrier diffusion lengths are shorter in high impurity concentration substrates than in low impurity concentration substrates, so that the use of high impurity concentration substrates degrades quantum efficiency and is undesirable for that reason.

In the method employed in this present Example for the manufacture of a gallium arsenide photocathode, knock-on implantation of zinc is employed to form a high acceptor concentration in a shallow layer at one major surface of a p - type substrate 91 having a low acceptor concentration of $10^{15}$ atoms/c.c. In this manner, energy band bending occurs over a very short distance at the surface while the bulk of the substrate has a long diffusion length for electrons so that more electrons are ejected by photoemission.

The method is performed in the following manner.

Under a vacuum of approximately $10^{-10}$ torr, the high quality p-type gallium arsenide substrate 91 is cleaved, and zinc is evaporated onto a cleaved major surface 92 of the substrate 91 to form a layer 93 having a thickness of approximately 550 A.

Figure 14:
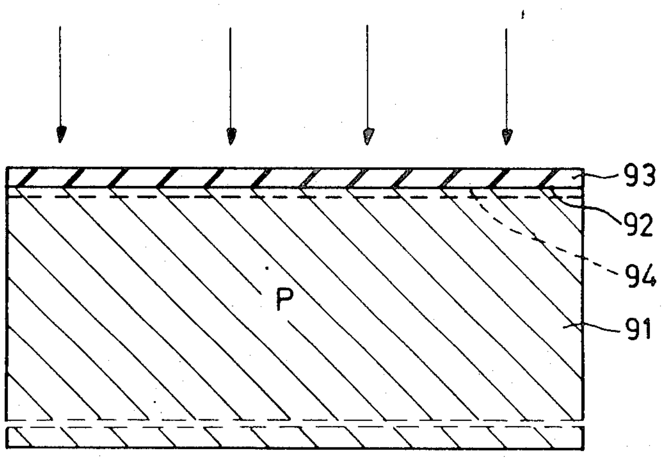
FIGS. 14 and 15 are cross-sectional views of a semiconductor body of photo-cathode at various stages during manufacture.
Figure 15:
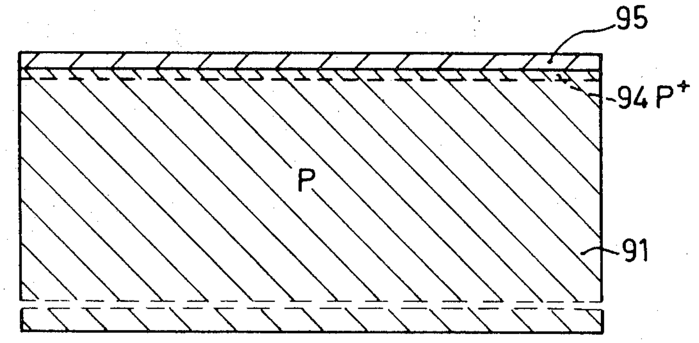

The substrate 91 with the layer 93 is placed in an ion chamber, and, as illustrated by arrows in FIG. 14, the layer 93 is bombarded with 100 keV, xenon ions in order to cause by energy transfer zinc atoms from the layer 93 to enter an underlying surface portion of the substrate 91 and be implanted therein. The bombarding xenon ions are absorbed in the zinc layer 93. Zinc is an acceptor impurity in gallium arsenide; the implanted zinc atoms increase significantly the acceptor concentration of a surface layer 94 of the substrate 91, which surface layer 94 is less than 200 A. deep. In this manner, a shallow, high acceptor concentration layer 94 is formed at one major surface 92 of a low impurity concentration p - type gallium arsenide substrate 91.

After bombardment, the substrate 91 is given a very short dip etch in hydrochloric acid to remove excess zinc, and is then placed in a vacuum chamber. The substrate 91 is heat cleaned under vacuum at 600°C for 5 to 10 minutes. Any remaining excess zinc vapourizes from the surface 92, and the substrate 91 anneals rendering the knocked-on implanted zinc electrically active. Subsequently, under the same vacuum, caesium and oxygen are deposited alternately on the surface 92 of the substrate 91 at room temperature to form a layer 95 (see FIG. 15), while the photo-emission from the surface 92 is continuously monitored. the surface 92 is treated in this manner with caesium and oxygen until the photo-emission passes through a maximum.

It will be evident that many modifications are possible within the scope of the invention as defined in the appended Claims. Although in the methods described, a portion of the layer comprising the said element is subjected to a single ion bombardment by a single ion species, portions of such layers may be subjected to several bombardments by different ion species possibly at different energies. Furthermore, the energy of ions bombarding a portion of the layer may be varied over the bombardment period to provide a desired implantation concentration profile in the portion of the solid below the portion of the layer. In the methods described for the manufacture of semiconductor devices it is evident that other suitable conventional techniques and/or materials may be used, for example, other semiconductor, insulating and/or passivating, and conducting materials, impurity elements and ion species.

What is claimed is:

1. A method of manufacturing a semiconductor device comprising providing a layer on a semiconductor body surface and bombarding the layer covered surface with ions in order to cause by energy transfer atoms of an element from the layer to enter an underlying surface portion of the body and be implanted therein to change the electrical characteristics of said surface portion, the composition and thickness of the material on the semiconductor body surface in the path of the bombarding ions being such that the majority of the ions bombarding the layer are absorbed in the layer without entering the semiconductor body.

2. A method as claimed in claim 1 wherein the layer consists substantially of a metal having impurity properties with a thickness such that substantially all of the bombarding ions are absorbed therein.

3. A method as claimed in claim 1 wherein the thickness of the layer is at the most 0.1 micron.

4. A method as claimed in claim 3 wherein the thickness of the layer is at least 0.05 micron.

5. A method as claimed in claim 1 wherein said layer is provided on another layer on the semiconductor body surface, and the composition and thickness of the two layers are such that the majority of the ions bombarding the layer are absorbed without entering the semiconductor body, while atoms of the element from the layer penetrate the other layer and enter the semiconductor body.

6. A method as claimed in claim 1 wherein the ions are of an inert gas and are obtained from a gas discharge.

7. A method as claimed in claim 6 wherein the inert gas is argon or krypton and the ions have energies in the range of 10 keV to 100 keV.

8. A method as claimed in claim 1 wherein the layer is a metal layer electrode which forms a Schottky-type junction with the semiconductor body surface, and the atoms from the metal layer entering the said surface portion form at the surface an intimate rectifying contact between the metal layer electrode and the semiconductor body.

9. A method as claimed in claim 1 wherein the element is an impurity element characteristic of one conductivity type of the semiconductor body material, and atoms of the impurity element of the one conductivity type enter a portion of the semiconductor body of the one conductivity type.

10. A method as claimed in claim 9 wherein the semiconductor device is a semiconductor photocathode, and the implanted atoms of the impurity element increase the impurity concentration of the one conductivity type of a shallow surface region of the semiconductor body portion of the one conductivity type to permit enhancement of photo-emission therefrom.

11. A method as claimed in claim 1 wherein atoms of the impurity element of the one conductivity type enter a portion of the semiconductor body of the opposite conductivity type.

12. A method as claimed in claim 11 wherein the semiconductor device is a device for detecting and/or measuring radiation, the layer is provided over the whole of one major surface of the semiconductor body portion of the opposite conductivity type and bombarded with the ions to cause atoms of the impurity element to enter the whole of the one major surface and to form in the semiconductor body a shallow surface-adjacent region of the one conductivity type which forms with the adjacent semiconductor body portion of the opposite conductivity type a radiation-sensitive p-n junction.

13. A method as claimed in claim 1 wherein a masking layer pattern is provided selectively at the semiconductor body surface, and the said layer is provided on the masking layer pattern and on at least one unmasked portion of the semiconductor body surface, the composition and thickness of the masking layer pattern being such that, when the ions are directed at the whole of the said semiconductor body surface, atoms from the said layer entering the masking layer pattern do not enter the semiconductor body surface so that implantation is selective in the semiconductor body surface.

14. A method as claimed in claim 9 wherein another layer comprising an impurity element characteristic of the opposite conductivity type is provided on the semiconductor body surface and the two layers are bombarded simultaneously with ions which by energy transfer cause atoms of the two impurity elements to enter the semiconductor body surface to change in a desirable manner electrical characteristics associated with surface portions of the semiconductor body.

15. A method as claimed in claim 14 wherein the layer comprising the impurity element characteristic of the one conductivity type is provided on the said other layer on a portion of the semiconductor body of the opposite conductivity type.

16. A method as claimed in claim 15 wherein the semiconductor device comprises a bipolar transistor having an emitter region of the said opposite conductivity type and a base region of the one conductivity type, in which, during the ion bombardment, atoms of the impurity element characteristic of the one conductivity type enter the semiconductor body from one layer to form a region of the one conductivity type associated with the base region of the transistor, and heavier atoms of the impurity element characteristic of the opposite conductivity type enter the semiconductor body to a shallower level from the other layer to form a region of the opposite conductivity type associated with the emitter of the transistor.

17. A method as claimed in claim 15 wherein the two layers are provided over the whole of the said semiconductor body surface and scanned by a modulated energy beam of the ions, the energy modulation being such that atoms of the two impurity elements are selectively implanted in the semiconductor body surface to form semiconductor regions of desired configuration.

18. A method as claimed in claim 2 wherein, following the ion bombardment step, at least part of the metal layer is retained on the semiconductor to serve as an electrical contact for the underlying semiconductor portion.

* * * * *